United States Patent [19]

Valeriote et al.

[11] 4,291,284

[45] Sep. 22, 1981

[54] ANTENNA COUPLER

[76] Inventors: Michael A. Valeriote, R.R. #1, Puslinch, Ontario; Louis C. Kellman, 210 Edinburgh Rd. N.; Don E. Brandigampola, 40 Venier Dr., #903, both of Guelph, Ontario, all of Canada

[21] Appl. No.: 76,351

[22] Filed: Sep. 17, 1979
(Under 37 CFR 1.47)

[51] Int. Cl.³ .......................... H03H 7/38; H03H 7/40
[52] U.S. Cl. .................................... 333/17 M; 333/32; 336/144; 455/120; 455/125
[58] Field of Search .............................. 333/17 M, 32; 334/56-58; 336/138, 137, 144; 343/860-862; 455/120, 121, 123, 125

[56] References Cited
U.S. PATENT DOCUMENTS 2,619,616  11/1952  Starner ........................... 336/138 X
3,870,979  3/1975  Baxter et al. ......................... 455/120

Primary Examiner—Paul L. Gensler

[57] ABSTRACT

A high power, high frequency radio transmitter is connected to an antenna through an adjustable impedance coupling device which comprises a helical coil having a number of straight-sided triangular turns. Remotely operable, pneumatic cylinders are mounted on each side or segment of the coil turns in electrical contact therewith and have piston rods which can be moved into and out of electrical contact with a respective fixed conductive member or bus disposed alongside the coil. Additionally, a number of capacitors can be connected into the coupler circuit as required by the similar movement of piston rods into contact with a similar bus, each such piston rod being housed within a pneumatic cylinder electrically connected to a respective one of such capacitors.

26 Claims, 5 Drawing Figures

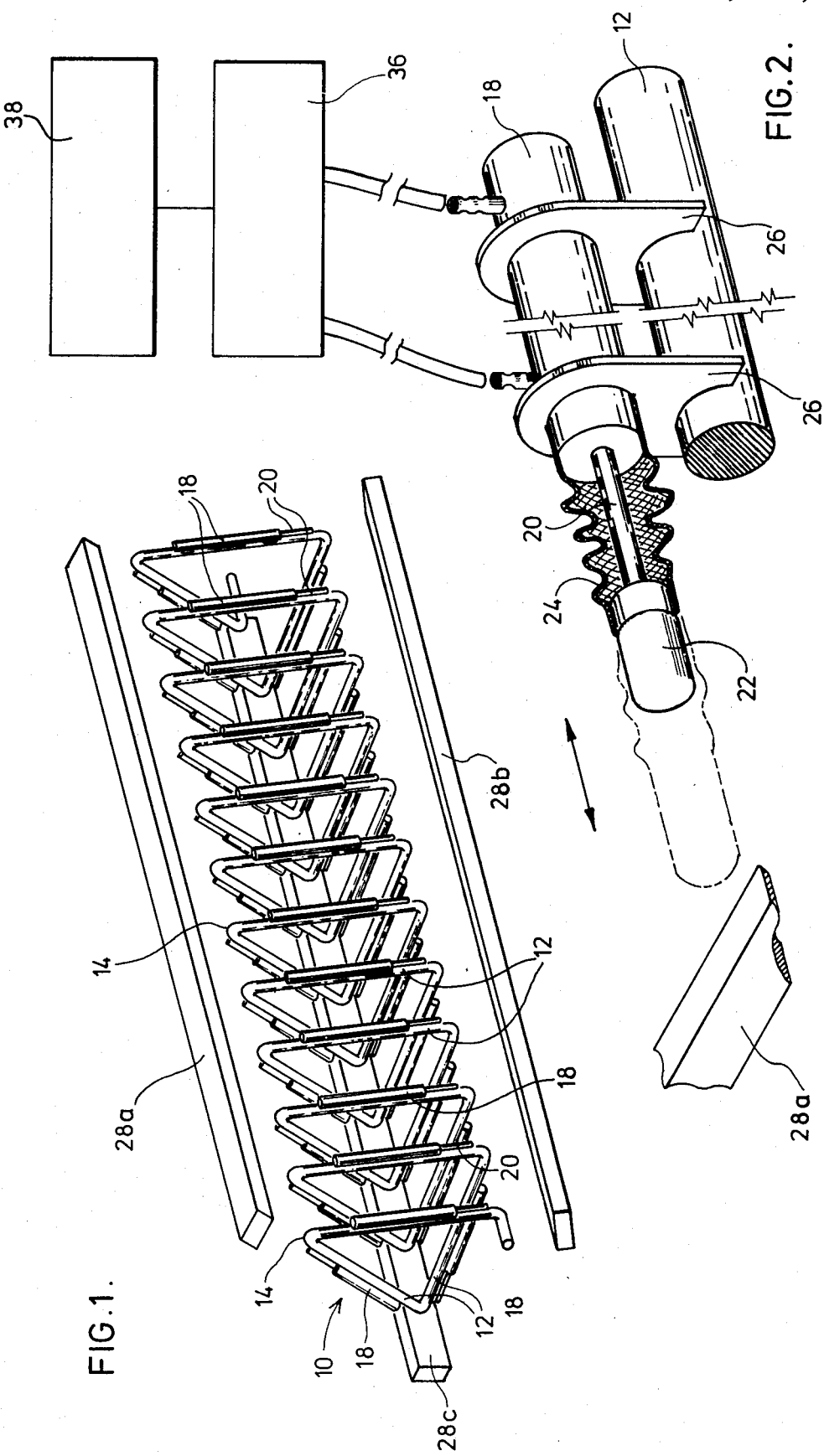

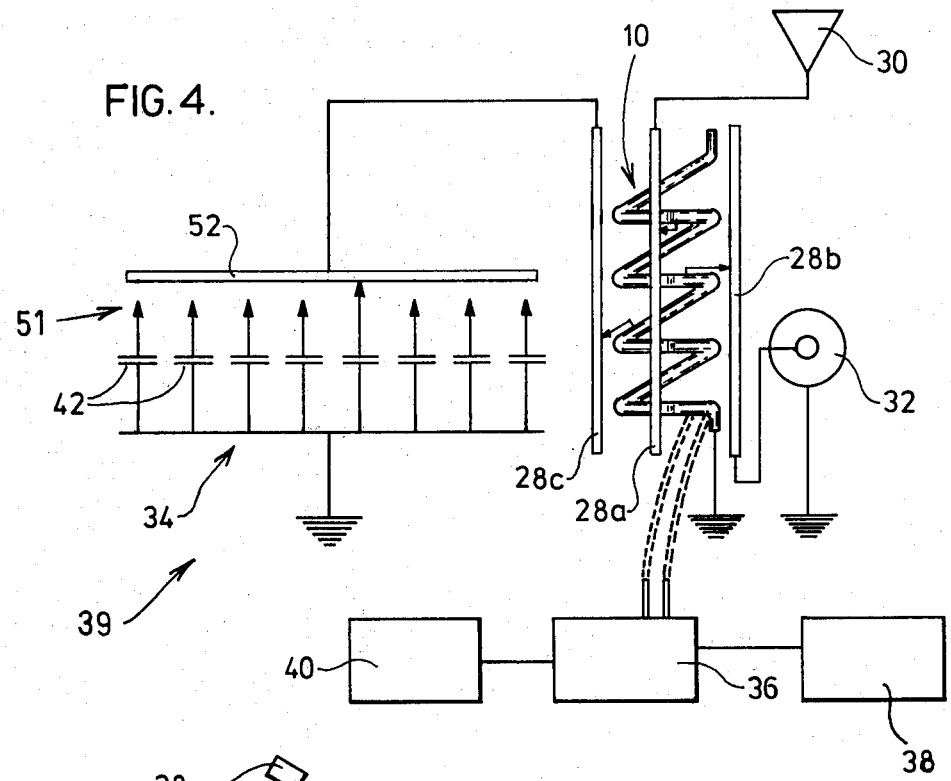
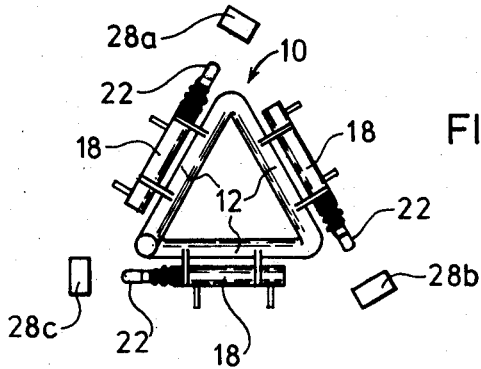
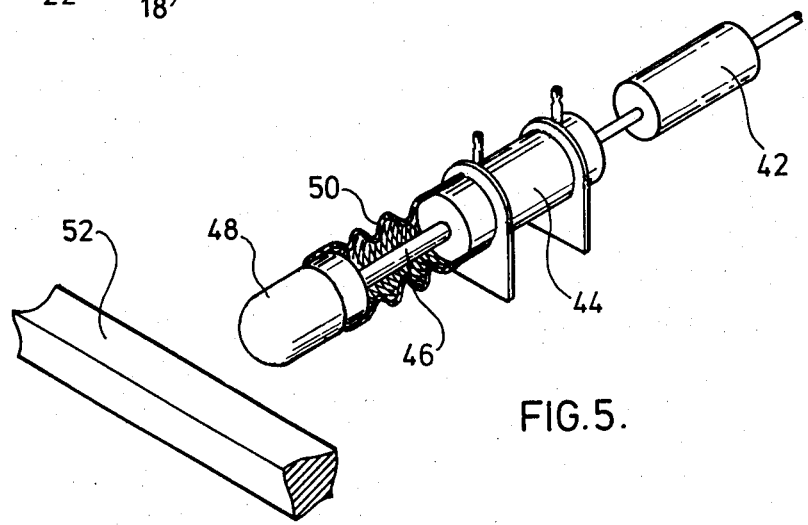

ANTENNA COUPLER

BACKGROUND OF THE INVENTION

The present invention relates to an impedance coupling device and more particularly to an antenna coupler for use in matching an antenna to a high power transmission line so to enable a high power signal to be radiated with maximum efficiency.

It is well known that an antenna must be tuned or matched to its transmission line for the frequency of the signal being radiated for the purpose of achieving maximum efficiency. At low and medium signal powers, such tuning or matching presents no serious problems. Such coupling can be achieved in a variety of ways, for example, by adjusting capacitor values and by the use of tuning coils. Electronic circuitry is also available for detecting circuit conditions and automatically adjusting the coupling device so as to produce the most effective matching of the antenna with the transmission line for the particular signal under any given conditions.

It should, of course, by borne in mind that the matching of an antenna with its feed line may require different adjustments, depending upon weather conditions and the surrounding conditions of the earth as well as when the signal frequency is varied.

At higher signal powers, however, the effecting of the necessary adjustments to produce efficient antenna coupling presents a more serious problem. For example, with signal frequencies of 1.6 to 30 MHZ at powers in excess of 1 KW, matching has, generally speaking, been effected by manually connecting and disconnecting various components. Such various components are often mounted permanently in position and provided with terminals to facilitate their connection and disconnection. This known procedure, however, requires relatively complicated equipment and also involves serious interruptions in transmission, when the equipment is being adjusted for different signal frequencies.

It can also involve a serious health hazard if the power is not totally interrupted while the adjustments are made.

In addition to being slow and cumbersome, this known system presents the further disadvantage that errors may occur in connecting the terminals of the various components with the result that the matching of the antenna for a new signal might not be achieved.

The use of conventional electrical relays for effecting such connection and disconnection of components is not possible in the presence of the high power electromagnetic fields surrounding such equipment. Additionally, any attempt to isolate conventional relays from such fields, for example, by locating them at a distance from the equipment is impractical since then the length of the electrical conductors between the coupler and such relays would then alter the performance of the coupler. Accordingly, while the problems surrounding the use of manually changeable terminals are quite obvious and have been apparent for many years, no completely satisfactory solution to the problem has heretofore been found.

SUMMARY OF THE INVENTION

The present invention resides in the provision of an impedance coupling device and particularly an antenna coupler in the form of a reactive circuit in turn comprising an electrically conductive member, a plurality of reactive elements, a plurality of movable contact elements operatively associated with respective ones of said reactive elements for electrically connecting and disconnecting respective ones of said reactive elements and said electrically conductive member, and a plurality of actuating means operatively associated with respectives ones of said contact elements and remotely actuable in the presence of an electromagnetic field generated by said reactive circuit so to connect and disconnect respective ones of said reactive elements and said electrically conductive member so in turn to vary the electrical characteristics of said reactive circuit.

Preferably the actuating means are in the form of mechanical actuators such as field operated cylinders, the piston rods of which constitute the aforementioned contact elements and which are operable in response to fluid pressure, typically air, gas or hydraulic fluid, or are other actuator systems which are unaffected by such exposure to high power radiation.

Such fluid operated cylinders when used in a coupling device in accordance with the invention, will generally be connected to a fluid flow control system through control lines, such as flexible or rigid hoses which are of an electrically nonconductive and preferably nonmetallic material so that they will be unaffected by the electromagnetic radiation and so to minimize any alteration of the electrical performance characteristics of the coupling device.

In one embodiment of this invention, the coupling device preferably comprises a coil consisting of a plurality of linear metallic bar or rod segments joined end to end to form a coil typically having a triangular or other polygonal configuration.

In such a construction, the actuating means will also preferably be of generally linear shape, and will be arranged parallel to and secured to the linear segments of such a coil. The actuating means are spaced from such segments a short distance so that the coil together with the actuating means, when subjected to high power signals, will essentially behave, electrically, as a single unit thereby facilitating calculation of the correct matching for the antenna. In this way, the presence of the actuating means alongside the conductive segments of the coil will not impair the utility of that coil. In such an embodiment, there is usefully provided at least one electrically conductive member in the form of a connector bar or bus which extends lengthwise alongside the coil but spaced therefrom, the aforementioned piston rods then being capable of being extended into contact with such a bus for selective connection of different portions of the coil.

When the coil has a triangular configuration, a fluid operated cylinder is usefully provided on each of the three segments of each turn of such a coil and there are then provided three connector or bus bars, located to one side and along each corner of the triangle for contact by piston rods from those cylinders mounted along respective faces of the coil.

In another embodiment of an antenna coupler in accordance with this invention, a bank of capacitors is provided with each such capacitor being connected to a fluid actuated cylinders having a piston rods extendable and retractable relative thereto, so that one or more of such capacitors can be connected or disconnected to a bus for adjusting the electrical characteristics of the coupler.

It is also possible to provide adjustable coupling by providing both capacitors and coil segments which can be selectively connected into the coupler circuit, or disconnected therefrom.

If desired, means may be provided for automatic operation of the actuating means in preselected combinations. For example, a punched card system may be employed to secure precise high speed connection of a preselected combination of coil turn segments and individual capacitors for any given frequency or operating condition.

The various features of novelty which characterize the invention are pointed out with particularity in the claims annexed to and forming a part of this disclosure. For a better understanding of the invention, its opening advantages and specific objects attained by its use, reference should be had to the accompanying drawings and descriptive matter in which there are illustrated and described preferred embodiments of the invention.

BRIEF DESCRIPTION OF THE DRAWINGS

The invention will now be described merely by way of illustration with reference to the accompanying drawings, in which:

FIG. 1 is a perspective illustration of a coil of one embodiment of an antenna coupler according to the present invention;

FIG. 2 is an enlarged perspective illustration partly in section of part of the coil shown in FIG. 1 and also showing one of the fluid actuated cylinders mounted on that coil;

FIG. 3 is an end elevation of the coil shown in FIGS. 1 and 2;

FIG. 4 is a schematic diagram showing an alternative embodiment of an antenna coupler in accordance with this invention;

FIG. 5 is a perspective view partly in section of a pneumatic cylinder forming part of the coupler shown in FIG. 4.

DESCRIPTION OF THE PREFERRED EMBODIMENTS

Referring first to FIG. 1 of the drawings, it will be seen that there is shown therein a generally triangular electrically conductive coil generally indicated by the legend 10. The coil 10 is made up of a plurality of turns, each of which in turn comprises three linear segments 12.

The linear segments 12 of each of the turns of the coil 10 are joined together at corners 14 so as to form a continuous triangular shaped helix. The size of the segments 12 and of the coil 10 will of course depend upon the signal frequency and the desired power output that the coil is required to handle but, in general, such a coil will be metallic and will typically be formed of copper in either cylindrical or rectangular bar stock form.

It will of course be appreciated that the triangular configuration shown is merely for the sake of illustration. The coil 10 could equally well be square or indeed any other shape which is convenient for manufacturing purposes. In general, however, each turn of such a coil will generally have a polygonal configuration formed from a plurality of linear segments.

On and along each of the segments 12, there is mounted a fluid operated cylinder 18, each such cylinder 18 having a piston rod 20 housed therein and extending therefrom. Such cylinders 18 are shown in the accompanying drawings as being pneumatically operated from any suitable source of compressed air. It should of course be understood that they could equally well be operated using any other gas or any suitable hydraulic fluid. Within the interior of the cylinders 18 there are of course pistons (not shown) and the cylinders 18 will be of a double acting type, that is to say, compressed air may be admitted at both ends so that the piston rods 20 may be extended or retracted at will.

On the free ends of the piston rods 20, there are provided electrical contact caps 22 (see FIG. 2). Around the piston rods 20, there are provided flexible electrically conductive sleeves 24, each of which is connected at one end around and to a respective one of the cylinders 18 and at its other end around and to the contact cap 22.

The cylinders 18 are mounted on respective ones of the coil segments 12 by means of mounting flanges 26 as particularly shown in FIG. 2.

The cylinders 18, the piston rods 20 and the mounting flanges 26 are all formed of an electrically conductive material and particularly of a metal, for example, brass, steel or the like. The sleeve 24 is preferably formed of woven copper wire, to provide a flexible sheath such that it may permit extension (as shown in phantom outline in FIG. 2) and retraction of the piston rod 20, while ensuring good electrical connection between the contact cap 22 on the free end of the piston rod 20 and the cylinder 18 itself.

With the construction illustrated, the cylinders 18 with their associated piston rods 20, contact caps 22 and sleeves 24 have a minimum effect on the electrical performance characteristics of the coil 10 during use.

Adjacent but spaced outwardly from the three corners of the coil 10, there are provided three connector or "bus" bars 28a, 28b, 28c which are located so that they will be contacted by the contact caps 22 on the free ends of the piston rods 20 when those piston rods 20 are extended from the cylinders 18 (see FIG. 3).

The bars 28a, 28b and 28c are supported in position by any suitable means (not shown). Their precise locations will of course depend upon the orientation of the cylinders 18, the lengths of the piston rods 20 and the directions of movement of the piston rods 20.

In use, the coil 10 will form part of an antenna coupler and will be connected by the bars 28a, 28b and 28c to an antenna indicated schematically at 30 and to a signal generator indicated schematically at 32 in FIG. 4 of the drawings.

In order to control operation of the pneumatic cylinders 18, they are connected to a suitable control mechanism indicated generally at 36 and a source of compressed air shown at 38. By operation of appropriate valves (not shown) in the control mechanism 36, any selected combination of the cylinders 18 can be operated so as to extend their respective piston rods 20 to make electrical contact between their contact caps 22 and a respective one of the connector bars 28a, 28b and 28c.

Operation of other such valves (not shown) will procure retraction of any other piston rods that may be extended.

If desired, a master valve (not shown) may be provided for procuring retraction of all the piston rods for the purpose of cancelling any existing setting prior to establishing a new setting.

In accordance with another embodiment of this invention and in order to provide even greater tunability, an antenna coupler as indicated generally at 39 in FIG. 4 is provided with a capacitor bank generally indicated at 34. It will be seen that, in this particular embodiment of the invention as illustrated, the capacitor bank 34 comprises eight capacitors 42. The capacitors 42 are arranged so that one side of each of those capacitors is connected to a common conductor.

As shown in FIG. 5, the other terminals of the capacitors 42 have rigidly mounted thereon eight pneumatic cylinders 44, each having a piston rod 46, a contact cap 48 and a conductive sleeve 50 in the same manner as for the cylinders 18 described in connection with the coil 10. It is to be noted that, to simplify the drawings, the cylinders 18 are not shown in FIG. 4 while the cylinders 44, the piston rods 46, contact caps 48 and sleeves 50 are indicated schematically in that figure by the arrows 51.

A capacitor connector or bus bar 52 is provided in the coupler 39 for contact by the contact caps 48 and such bar 52 is, in the embodiment illustrated, connected to the bus 28c of the coil 10.

By operation of one or more of the cylinders, the corresponding capacitor or capacitors 42 of the bank 34 may be selected and connected into the circuit, leaving the remaining capacitors disconnected.

It will now be understood that, even when operating at high powers, the number of turns of the coil 10 and also the combination of the capacitors 42 connected in the coupler circuit can easily be varied so as to ensure optimum matching of the antenna with the signal generator, such matching being achieved by operation of the pneumatic cylinders 18 and 44. All of this may be achieved in accordance with this invention by remote operation without the need for shutting down the equipment while such adjustment is carried out.

If desired, operation of the control mechanism 36 can be effected using an automatic controller 40 (FIG. 4) for obtaining actuation of predetermined combinations of valve settings in the control mechanism 36 so in turn to obtain automatic operation of preselected combinations of the cylinders 18 and 44. Such automatic controllers are well known and require no further description herein. Where, for example, the coil 10 has a total of twelve turns, that is to say thirty-six turn segments 12, and the capacitor bank 34 comprises eight capacitors 42, then the automatic controller 40 will simply be required to have a sufficient capacity to permit the desired operation of the valves for forty-four cylinders in a sufficient number of predetermined combinations. The number of different valve combinations will, of course, depend on the number of different frequency bands at which the antenna is to be used. Frequently, the antenna and the signal generator will be designed for operation over a specific number of frequency bands, and the automatic controller 40 will then simply be programmed to provide appropriate settings of valves and cylinders to suit all conditions for each such frequency band.

Such an automatic controller can, for example, be of the punched card type. Alternatively, such valves can be manually operated.

The foregoing is a description of a preferred embodiment of the invention which is given here by way of example only. The invention is not to be taken as limited to any of the specific features as described, but comprehends all such variations thereof as come within the scope of the appended claims.

What is claimed is:

1. An impedance coupling device in the form of a reactive circuit in turn comprising;
  a plurality of reactive elements each being a segment of an inductor coil;
  at least one electrically conductive member unconnected to said elements;
  a plurality of movable contact elements operatively associated with respective ones of said reactive elements for electrically and selectively connecting and disconnecting respective ones of said reactive elements and said at least one electrically conductive member, and,
  a plurality of fluid operated cylinders each housing a movable piston having a piston rod effectively constituting a respective one of said movable contact elements, and forming remotely operable actuating means and being unaffected by the presence of an electromagnetic field generated by said reactive circuit so to connect and disconnect respective ones of said reactive elements and said at least one electrically conductive member so in turn to vary the electrical characteristics of said reactive circuit.

2. An impedance coupling device as claimed in claim 1 and in which each said fluid-operated cylinder is pneumatically operated.

3. An impedance coupling device as claimed in claim 1 and in which each said contact element is electrically connected to a respective one of said reactive elements for movement into electrical connection with said electrically conductive member and for movement out of such electrical connection with that electrically conductive member.

4. An impedance coupling device as claimed in claim 3 and which additionally comprises control means for automatically moving at least one predetermined combination of said contact elements into and out of electrical connection with said electrically conductive member.

5. An impedance coupling device as claimed in claim 3 and in which each said segment of said coil has an essentially linear configuration.

6. An impedance coupling device as claimed in claim 5 and in which said coil comprises a plurality of polygonal turns with said contact elements mounted on a plurality of mutually parallel segments of said turns.

7. An impedance coupling device as claimed in claim 6 and which comprises at least two said electrically conductive members, one for electrical contact with said contact members mounted on a first said plurality of mutually parallel segments of said turns and the other for electrical contact with a plurality of said contact members mounted on another plurality of mutually parallel segments of said turns.

8. An impedance coupling device as claimed in claim 7 wherein said coil is formed of a conductive bar member bent into a series of triangular configurations forming a generally triangular-shaped helix, and including one said fluid operated cylinder for each said reactive element, and wherein there are three said electrically conductive members, extending essentially along the apeces of said triangular coil, and being oriented for contacting by respective movable contact elements, operated by respective said fluid operated cylinders.

9. An impedance coupling device as claimed in claim 8 and in which each said actuating means comprises a fluid-operated cylinder housing a movable piston having a piston rod constituting a respective one of said contact elements and electrically connected to a respective one of said segments of said turns of said coil.

10. An impedance coupling device as claimed in claim 9 and in which each said fluid-operated cylinder is pneumatically operated.

11. An impedance coupling device as claimed in claim 9, in which each said fluid-operated cylinder is formed of an electrically conductive material and is mounted directly on a respective one of said segments of said turns of said coil so as to be in electrical contact therewith and in which an electrically conductive head on the outer end of a respective one of said piston rods is electrically connected to said cylinder through a flexible metallic sleeve secured to and extending between said cylinder and said head.

12. An impedance coupling device as claimed in claim 3, and including further reactive elements comprising a bank of capacitors connected in circuit with said at least one electrically conductive member and movable connection means for each of said capacitors whereby the same may be selectively connected or disconnected in said circuit, and remotely operable actuating means for said connection means, operable in the presence of the electromagnetic field generated by said reactive circuit.

13. An impedance coupling device as claimed in claim 12 and in which each said actuating means comprises a fluid-operated cylinder housing a movable piston having a piston rod constituting a respective one of said contact elements and electrically connected to a respective one of said capacitors.

14. An impedance coupling device as claimed in claim 13 and in which each said fluid-operated cylinder is pneumatically operated.

15. An impedance coupling device in the form of a reactive circuit in turn comprising;
   inductor coil means formed of a continuous elongated reactive member shaped to define a plurality of linear reactive elements, joined by angled bends and arranged around a central axis;
   at least one electrically conductive member unconnected to said elements spaced from and parallel to said axis;
   a plurality of remotely operable contact actuating means attached and electrically connected to respective ones of said linear reactive elements and being unaffected by the presence of an electromagnetic field generated by said reactive circuit;
   a plurality of movable contact elements carried by respective ones of said actuating means and operable thereby for electrically and selectively connecting and disconnecting respective ones of said reactive elements and said at least one electrically conductive member, and,
   control means connected to respective contact actuating means for selective remote operation thereof, said control means being formed of non-reactive material whereby it is substantially unaffected by magnetic fields generated by said reactive circuit.

16. An impedance coupling device as claimed in claim 15 wherein said contact actuating means are of linear shape and are located parallel to, but spaced from, respective reactive elements, whereby said coil, and said contacting actuating means, when subjected to high power signals, will behave electrically as a single unit.

17. An impedance coupling device as claimed in claim 15 and in which said coil comprises a plurality of polygonal turns with said contact elements mounted on a plurality of mutually parallel segments of said turns.

18. An impedance coupling device as claimed in claim 17 and which comprises at least two said electrically conductive members, one for electrical contact with said contact members mounted on a first said plurality of mutually parallel segments of said turns and the other for electrical contact with a plurality of said contact members mounted on another plurality of mutually parallel segments of said turns.

19. An impedance coupling device as claimed in claim 15 and in which each said actuating means comprises a fluid-operated cylinder housing a moveable piston.

20. An impedance coupling device as claimed in claim 19 wherein said coil is formed of a conductive bar member bent into a series of triangular configurations forming a generally triangular-shaped helix, and including one said fluid operated cylinder for each said reactive element, and wherein there are three said electrically conductive members, extending essentially along the apices of said triangular coil, and being oriented for contacting by respective movable contact elements, operated by respective said fluid operated cylinders.

21. An impedance coupling device as claimed in claim 20 and in which each said actuating means comprises a fluid-operated cylinder housing a movable piston having a piston rod constituting a respective one of said contact elements and electrically connected to a respective one of said segments of said turns of said coil.

22. An impedance coupling device as claimed in claim 15 and including further reactive elements comprising a bank of capacitors connected in circuit with said at least one electrically conductive member, and movable connection means for each of said capacitors whereby the same may be selectively connected or disconnected in said circuit, and remotely operable actuating means for said connection means, operable in the presence of the electro-magnetic field generated by said reactive circuit.

23. An impedance coupling device as claimed in claim 21 in which each said fluid-operated cylinder is formed of an electrically conductive material and is mounted directly on a respective one of said segments of said turns of said coils so as to be in electrical contact therewith and in which an electrically conductive head on the outer end of a respective one of said piston rods is electrically connected to said cylinder through a flexible metallic sleeve secured to and extending between said cylinder and said head.

24. An impedance coupling device as claimed in claim 15 and including further reactive elements comprising a bank of capacitors connected in circuit with a said electrically conductive member, and movable connection means for each of said capacitors whereby the same may be selectively connected or disconnected in said circuit, and remotely operable actuating means for said connection means, operable in the presence of the electro-magnetic field generated by said reactive circuit.

25. An impedance coupling device as claimed in claim 24 and in which each said actuating means comprises a fluid-operated cylinder housing a movable piston having a piston rod constituting a respective one of said contact elements and electrically connected to a respective one of said capacitors.

26. An impedance coupling device as claimed in claim 25 and in which each said fluid-operated cylinder is pneumatically operated.

* * * * *